United States Patent [19]

Kaplan et al.

[11] 4,344,984

[45] Aug. 17, 1982

[54] PROCESS FOR PRODUCING A LAYER CONTAINING SILICON

[75] Inventors: Daniel Kaplan; Pierre Landouar; Eric Criton, all of Paris, France

[73] Assignee: Thomson-CSF, Paris, France

[21] Appl. No.: 274,381

[22] Filed: Jun. 17, 1981

[30] Foreign Application Priority Data

Jun. 24, 1980 [FR] France .................. 80 13968

[51] Int. Cl.³ .................. H01L 31/18; H01L 31/02; H01L 31/06; C23C 11/06
[52] U.S. Cl. .................. 427/74; 427/87
[58] Field of Search .................. 427/74, 87

[56] References Cited

FOREIGN PATENT DOCUMENTS 2433871 3/1980 France .
WO/7900724 10/1979 PCT Int'l. Appl. .................. 427/39

OTHER PUBLICATIONS

Cretella et al., "Hydrogenated a-$Si_xGe_{1-x}$ for Solar Cells", *Extended Abstracts*, vol. 80-1, (1980), May, Princeton, Abstract No. 361, p. 896.

*Primary Examiner*—James R. Hoffman
*Attorney, Agent, or Firm*—Cushman, Darby & Cushman

[57] ABSTRACT

The process consists of introducing into the silicon-containing layer at the same time as silicon deposition, another element of column IVa of the periodic classification in a proportion equal to or below 5% of the number of silicon atoms and greater than 0.1%. According to a preferred variant, this element is germanium. Deposition takes place at a temperature close to the crystallization temperature T. The process can comprise a subsequent phase during which the deposited layer undergoes heat treatment in an atmosphere of a plasma containing hydrogen or one of its isotopes at a temperature below the crystallization temperature T of the layer.

8 Claims, 3 Drawing Figures

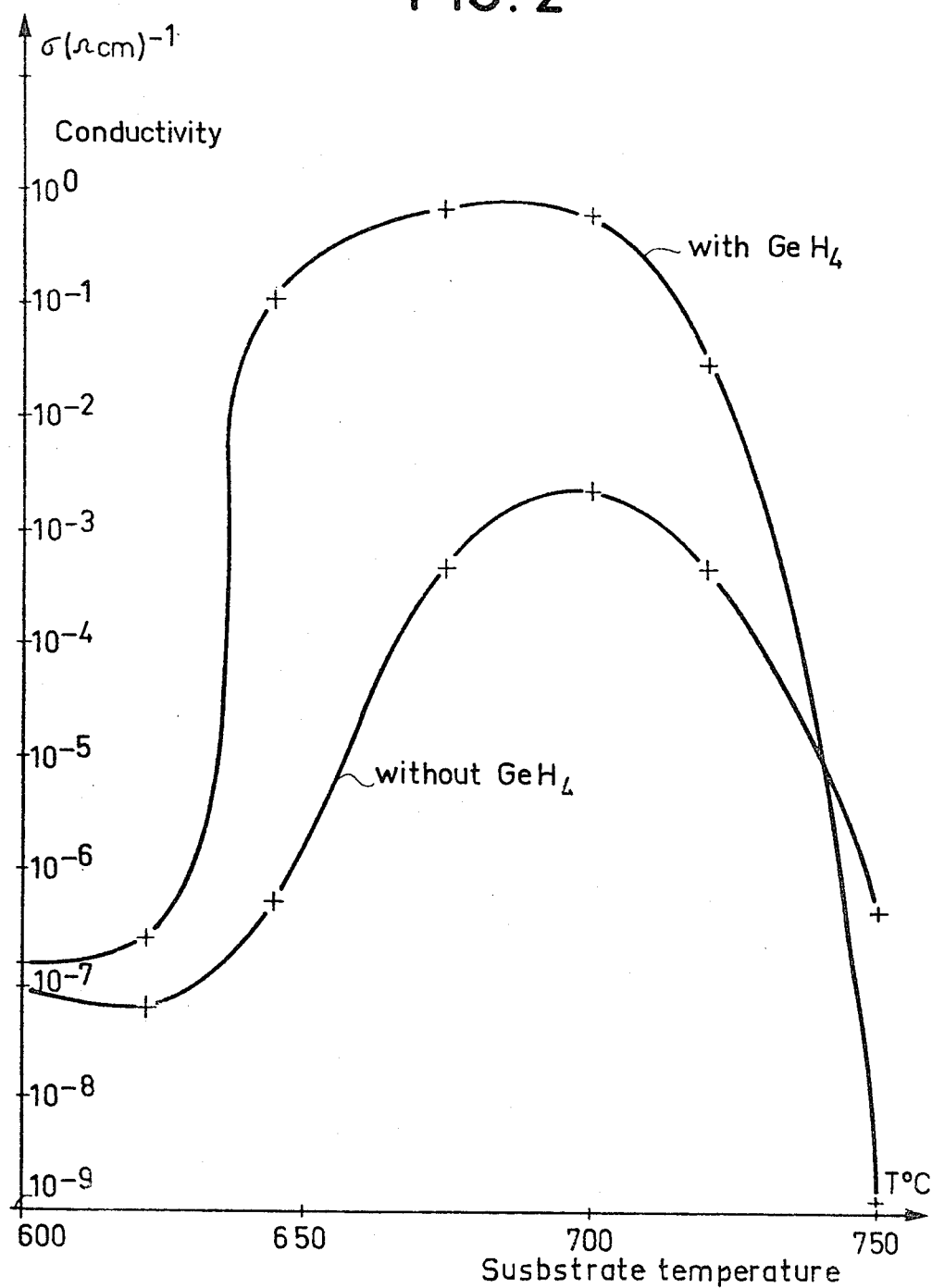

PROCESS FOR PRODUCING A LAYER CONTAINING SILICON

BACKGROUND OF THE INVENTION

The present invention relates to a process for producing semiconductor devices comprising a silicon layer. The invention more particularly applies to the manufacture of photoelectric conversion devices, such as photovoltaic cells.

Such semiconductor devices generally have a multilayer structure, comprising at least one p-n boundary or a metal-semiconductor contact. The most frequently used basic semiconductor material is silicon. The semiconductor material layers are produced by methods involving the deposition in thin layer form on a substrate, which in particular ensures the mechanical performance of the device.

On depositing a silicon film on a non-crystalline substrate, such as silica glass by any known process a monocrystalline layer is not obtained. The layer obtained has in fact a polycrystalline or amorphous structure, as a function of the deposition conditions and particularly the temperature under which deposition takes place.

In polycrystalline layers, there are grain boundaries between the various crystals, which have the effect of impairing the electrical qualities of the semiconductor layer. If the layer is not highly n or p doped, its conductivity is generally well below that of the corresponding crystal. Moreover, the conductivity depends on the temperature according to an exponential function, which is a major disadvantage in numerous applications. One explanation which has been proposed for this phenomenon is based on the existence of potential barriers at the grain boundaries, which have to be overcome by the carriers in order to be transported through the semiconductor layer. Finally, in polycrystalline form, silicon only has a limited light absorption, so that the minimum thickness of the layer to be deposited for obtaining an adequate efficiency is several dozen microns. However, one of the main factors limiting the production of photovoltaic devices is the cost. In order to reduce cost, it is consequently desirable to use layers having a minimum thickness and of approximately only one micron. For this purpose, it has been proposed to use silicon in amorphous form, its optical absorption being significantly higher than that of crystalline silicon.

However, in general, amorphous silicon has inferior electrical conductivity characteristics to crystalline silicon, even in the case of using processes of the type described in French Patent Application No. 77 17 245, filed on June 6th 1977 and published as U.S. Pat. No. 2,394,173 and European Patent Application No. 80.401 051.0 filed on July 11th 1980 and published as Ser. No. 002,4378, which lead to improvements in these characteristics.

BRIEF SUMMARY OF THE INVENTION

The process of the invention makes it possible to obtain semiconductor layers of limited thickness having the light absorption qualities inherent in amorphous silicon, whilst retaining a very good electrical conductivity.

The invention therefore relates to a process for producing a layer containing silicon by deposition on a support, wherein it comprises the introduction during deposition of at least one other element of column IVa of the periodic classification in a proportion equal to or below 5% of the number of silicon atoms and equal to or greater than 0.1% of the number of silicon atoms and wherein the deposition temperature is chosen from a predetermined temperature range, whose lower limit is equal to the crystallization temperature T of the said layer.

The invention also relates to a photoelectric conversion device comprising at least one layer containing silicon deposited on a support and obtained by this process.

BRIEF DESCRIPTION OF THE DRAWINGS

The invention is described in greater detail hereinafter relative to non-limitative embodiments and with reference to the attached drawings, wherein show:

FIG. 2 a comparative diagram showing the electrical conductivity properties of the layers obtained according to the invention compared with layers produced by a prior art process.

DETAILED DESCRIPTION OF THE PREFERRED EMBODIMENTS

The object of the invention is to obtain silicon layers produced by the thin layer or film deposition method. These layers retain the good light energy absorption properties of amorphous silicon and have an improved electrical conductivity. It has been found that this objective can be achieved by introducing a small quantity of at least one element differing from silicon during the deposition process. This element serves to reduce the effect of the grain boundaries. This element must not appreciably modify the properties of the silicon independent of those due to the granular structure. For example, it must not lead to a doping effect or a significant modification in the width of the forbidden band due to an alloying effect. These conditions can be simultaneously fulfilled by using an element of column IVa of the periodic classification (carbon, germanium tin or lead) in proportions between 0.1 and 5% of atoms of said element compared with the number of silicon atoms. A particularly interesting element is germanium.

A process which can be used for producing a semiconductor layer containing silicon revealing the advantages of the invention will now be described in non-limitative manner. This process comprises at least one deposition stage by the thermal decomposition of a gaseous mixture.

Figure 1:
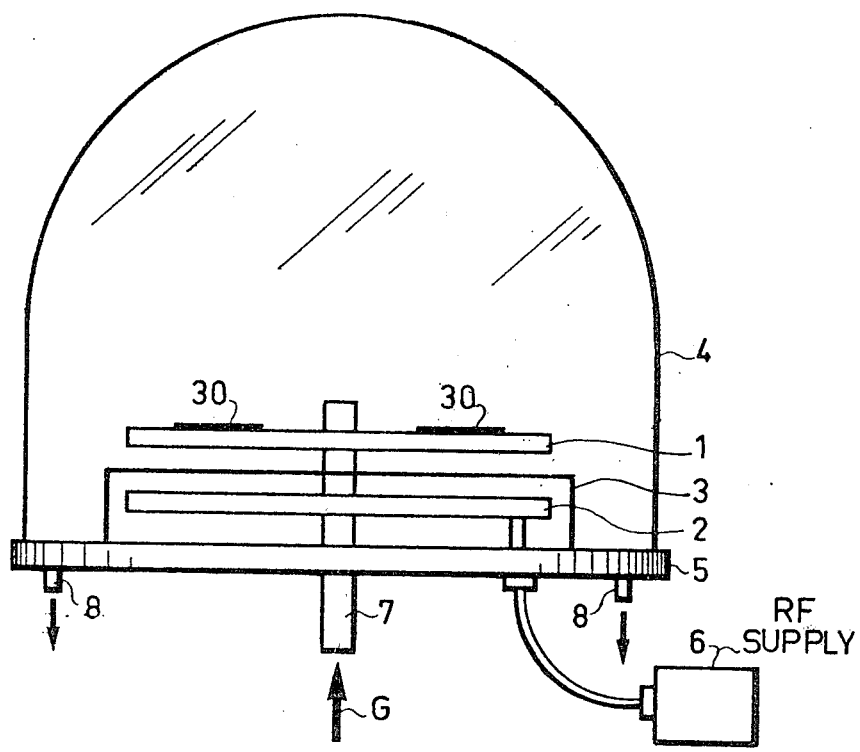
FIG. 1 diagrammatically, an apparatus permitting the deposition of layers according to the invention.

An apparatus for carrying out this deposition will firstly be described relative to FIG. 1. FIG. 1 diagammatically shows a reactor comprising a vertical reaction chamber and having the following components:

a circular graphite susceptor 1 covered with silicon carbide and resting on a quartz pedestal (not shown in the drawing), said susceptor-pedestal assembly rotating at a typical speed of 0 to 30 r.p.m;

a winding comprising a spiral choke 2 located in a plane parallel to the susceptor 1 and inductively coupled thereto, the choke being connected to a high frequency generator 6 operating at 400 kHz and having a power of 25 kW;

a quartz skirt 13 insulating the choke from the reaction chamber;

a quartz bell 4 resting on a quartz base 5, the system defining the volume of the reaction chamber;

an injector 7 located in the centre of the susceptor 5 and permitting the introduction of the gases G to be decomposed into the reaction chamber, said gases being discharged through the bottom of the reactor by means of orifices 8.

The gas flows are measured in conventional manner by means of ball-type flowmeter tubes equipped with stainless steel bellows valves. On susceptor 1 are shown devices which are being produced and which are given the reference numeral 30. These devices comprise at least one substrate on which will be deposited one or more layers in accordance with the process of the invention. Bell 4 can also have observation windows making it possible to measure the temperature of these devices 30 by means of infrared measuring devices. All these arrangements are well known to the Expert.

The method used for deposition purposes is also known per se. It consists of gaseous phase deposition under atmospheric pressure and involves a thermal decomposition of silane ($SiH_4$) which is the silicon source. The silane is mixed with argon or hydrogen, the latter gas giving better results, the volume proportion being 90% nitrogen or argon and 10% silane. The mixture may contain a third gas supplying the dopant, e.g. arsine for arsenic, diborane for boron or phosphine for phosphorus. The proportion of the latter gas compared with the silane must be regulated very accurately, as a function of the degree of doping which is required. This proportion typically varies between $10^{-6}$ to $10^{-3}$ molecules of doping gas per silane molecule. The substrate on which the silicon-containing layer is deposited is dependent on the structure of the electronic device to be produced. The preliminary treatment of the substrates does not fall within the scope of the invention and will not be described. The deposit increases at a speed of approximately 1 $\mu$m per hour.

In order to illustrate the invention, the electrical conductivity characteristics of a layer produced according to the process of the invention, ie. in which an element of column IVa has been introduced in the proportions given hereinbefore, have been compared with the electrical conductivity characteristics of a layer not containing said elements, i.e. a layer deposited by a prior art process. To permit this comparison, several layers were produced at different deposition temperatures, the other parameters being identical. A first series of layers was produced by decomposing a gas comprising hydrogen, silane ($SiH_4$) and phosphine ($PH_3$). A second series of layers was produced by decomposing a gas comprising the same elements and to which was added germane ($GeH_4$), the molecular proportion being $10^4$ molecules of silane per molecule of germane. This molecular proportion leads to approximately 1% germanium atoms compared with the number of silicon atoms in the deposited layer. The proportion was measured by AUGER spectography. This proportion falls within the range referred to hereinbefore (0.1 to 5%). The electrical conductivity in Ohms.cm$^{-1}$ of these various layers was measured as a function of the deposition temperature. The results of these measurements are given in the graph of FIG. 2. The scale of the conductivities is a logarithmic scale.

For deposition temperatures of approximately 600° C., the silicon obtained is amorphous and the electrical conductivity is low. The temperature at which crystallization starts is approximately 630° C. and conductivity is then significantly increased. The crystallization temperature can be defined by the known method of diffracting X-rays by a layer of material. Thus, it is known that a monocrystalline layer produces a regular diffraction grating as a result of the cubic diamond-type structure of the crystals. In the case of an amorphous layer, it is only possible to distinguish characteristic halos of the tetrahedal arrangement of the atoms. On observing the diffraction pattern, obtained for deposits made at increasing temperatures for low temperatures, the pattern is formed from the halos referred to hereinbefore, the layer being amorphous. As from a certain temperature T, which hereinafter will be called the crystallization temperature, there is seen to be a progressive modification of the halos in the sense of a contraction or narrowing. The halos tend to be transformed into narrow diffraction lines characteristic of a given crystal. This modification can easily be observed and makes it possible to accurately define the crystallization temperature T. Under given deposition conditions, more particularly defined by the structure of the reactor, in which decomposition takes place and by the composition of the gaseous mixture, the crystallization temperature is equal to the temperature T defined as hereinbefore. For pure silicon, it is equal to approximately 630° C. It has been found that for temperatures up to 50° C. above said temperature T, the optical absorption coefficient varies little and is therefore close to that of an amorphous layer deposited at a low temperature. Moreover, for deposition temperatures included in this temperature range, the layer obtained is very homogeneous and there is a continuous distribution of defects, particularly unformed chemical bonds.

On referring again to FIG. 2, it can be seen that the two electrical conductivity curves pass through a maximum for a temperature included in the given range. In addition, the layers produced according to the process of the invention, i.e. with the introduction of an element of column IVa, in the present case the element being germanium, has a very significantly improved conductivity. For example, for a deposition temperature of 640° C., the relationship between the conductivities of the layers obtained without germane and the layer obtained with germane is 1.4 $10^3$. For a temperature of 700° C. (maximum of the conductivity curve of the layers obtained by deposition with germane) the relationship is 2.8 $10^2$. Thus, the invention leads to a significant improvement in the electrical conductivity of the silicon-containing layers.

This experiment has also revealed another very important property showing that the process of the invention is of particular interest for the production of photovoltaic cells. The layer deposited at 645° C. and whose conductivity is close to the optimum has a high optical absorption close to that observed for the amorphous state. For higher temperatures (>680° C.) the layer again becomes highly transparent, as is the case with conventional polycrystalline silicon. For example, for a wavelength of 0.6 $\mu$m, the optical absorption coefficient is approximately 4 $10^4$ cm$^{-1}$. This coefficient can be compared with that of the amorphous state (deposition at 600° C.) which is approximately 5 $10^4$ cm$^{-1}$, whereas that of a typical polycrystalline layer is 5 $10^3$ cm$^{-1}$. This coefficient makes it possible to produce photoelectric conversion devices, e.g. photovoltaic cells, whose silicon-containing layer has a thickness equal to or below $10^{-4}$ cm. In the case of a conventional polycrystalline layer, this would lead to very low energy efficiency in view of the fact that few photons from the solar spectrum would be absorbed in such a device. The high optical absorption of the amorphous phase makes it possible to produce such photovoltaic cells in thin layer form, but the efficiencies of these cells are reduced due to the mediocre electrical transport properties of the amorphous structure. Layers deposited at a temperature of approximately 650° C. by the process of the invention consequently make it possible to obtain electrical properties well above those of amorphous layers, whilst retaining similar optical absorptions.

The invention is not limited to the layer deposition process described hereinbefore. It is also possible to use chemical vapour deposition processes (C.V.D. processes) either under pressure or under plasma, as well as the co-atomization process. In addition, silicon hydrides can be used in place of silane.

It has been stated in the introduction to the present description, that the electrical conductivity of the silicon in the amorphous state could be improved by using certain processes and particularly that described in European Patent Application No. 80 401 051.0. This process for the deposition of a layer containing silicon comprises a first stage of depositing the layer by the chemical decomposition of a gaseous mixture containing silane at a temperature close to the crystallization temperature and a second stage during which this deposited layer is treated in a hydrogen plasma at a temperature below the crystallization temperature. The deposition process used in the present invention can be identical to the first stage of the process described in the above European Patent Application, except that an element of column IVa of the periodic table is added in the specified proportions to the silicon of the deposited layer. The process of the present invention also differs by the selected deposition temperature, whilst the silicon obtained by the aforementioned application must be in the amorphous state. The good conductivity of the silicon layer obtained by the process of the invention can be further improved by treating the deposited layer by a method identical to that of the second stage of the aforementioned application. For this purpose, the deposited layer is treated in a plasma of hydrogen or one of its isotopes or a mixture thereof. The treatment is performed at a temperature of approximately 350° to 450° C., which is below the crystallization temperature T and serves to introduce hydrogen atoms into the unestablished chemical bonds in order to passivate the deposited layer. For example, a layer with a thickness of approximately 1 μm was produced by the process of the invention by the chemical decomposition of a gaseous mixture constituted by silane, phosphine and germane diluted in hydrogen. The deposition temperature was 645° C. and the time necessary for performing deposition was approximately 1 hour. The measured electrical conductivity of the layer was 2.5 Ohms.cm$^{-1}$. On referring once again to FIG. 1, a layer produced with the addition of germane, but without a subsequent treatment under plasma, has an electrical conductivity of approximately $1.2 \ 10^{-1}$ Ohms.cm$^{-1}$. Thus, treatment under plasma leads to an additional improvement to the conductivity in a ratio of approximately 20 in the present case.

In all cases, the silicon-containing layers obtained by the process of the invention, even without the aforementioned supplementary stage, make it possible to obtain a good energy efficiency when used in photoelectric conversion.

Figure 3:
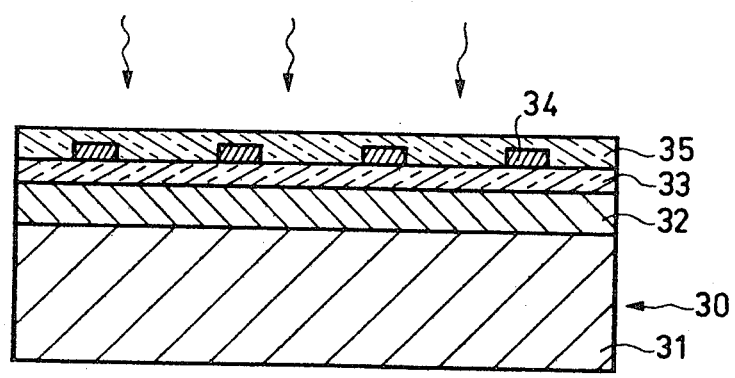
FIG. 3 an example of a photoelectric conversion device comprising a layer produced by the process of the invention.

As a non-limitative embodiment, a solar cell of the type comprising a metal-silicon junction is shown in FIG. 3. Solar cell 30 comprises a metal substrate 31 ensuring the mechanical rigidity of the assembly. Materials which can be used are aluminium, chrome, stainless steel and iron. A silicon-containing layer 32 is deposited on the upper face of the metal substrate 31 by means of the process of the invention. As stated hereinbefore, the thickness of this layer can be approximately 0.5 to 1 μm. In addition to silicon, e.g. germanium atoms have been introduced in the indicated proportion, i.e. in the range of 0.1 to 5% of germanium atoms. In addition, type n impurities have been introduced in a given proportion by incorporating phosphine into the gas introduced into the reactor of FIG. 1. The silicon-containing layer 32 is then covered with a thin metal film 33, e.g. of platinum, which remains transparent to the solar rays to which layer 32 is exposed as a result of its thinness. The interface between 32 and 33 forms a Schottky type junction. Photons traverse the metal film 33 substantially without being absorbed. However, they are absorbed by the silicon-containing layer 32 which, as stated hereinbefore, can have an absorption coefficient of approximately $4 \ 10^4$ cm$^{-1}$ for a wavelength of 0.6 μm, so that for a layer 32 of thickness 1 μm, the radiation portion absorbed differs only slightly from unity. The photons absorbed generate electron-hole pairs which are disoccurred in layer 32, thus freeing electrons which can circulate towards film 33. The device of FIG. 3 is completed by the addition of a metal grid 34 forming the electrode and made from a metal which is a good electrical conductor. The grid can, for example, be constituted by two parallel rows of wires, the wires of the first row being arranged orthogonally to those of the second row. The surface occupied by this electrode can be reduced to the minimum and can, for example, be approximately 5 to 10% of the useful surface of the device. This grid forming the electrode serves to uniformly collect the current circulating in film 33 with a low electrical resistance. Finally, an anti-reflection surface coating 35 is deposited on film 33 enveloping the grid forming electrode 34. As is well known in the art, the thickness e of this coating is linked with the wavelength by the following equation:

$$e = \lambda/4n$$

in which λ is the wavelength of the light radiation to be converted and n is the optical refraction index of coating 35. In the case of a wide spectrum an average wavelength value will be chosen. When the device is illuminated, it is possible to obtain an electrical current which is proportional to the illumination by connecting the grid forming electrode 34 on the one hand and conductive substrate 31 on the other to a not shown external load circuit.

What is claimed is:

1. A process for producing a layer containing silicon by deposition on a support, wherein it comprises the introduction during deposition of at least one other element of column IVa of the periodic classification in a proportion equal to or below 5% of the number of silicon atoms and equal to or greater than 0.1% of the number of silicon atoms and wherein the deposition temperature is chosen from a predetermined temperature range, whose lower limit is equal to the crystallization temperature T of the said layer.

2. A process according to claim 1, wherein the deposition temperature is chosen in a range, whose lower limit is T and whose upper limit is T+50° C.

3. A process according to claim 1, wherein the element of column IVa of the periodic classification is germanium.

4. A process according to claim 1, wherein the deposition takes place in the gaseous phase by chemical decomposition of a gaseous mixture comprising at least one silicon hydride.

5. A process according to claim 4, wherein the silicon hydride is silane.

6. A process according to claim 4, wherein the said gaseous mixture also comprises germane in such a way that germanium can be introduced into the layer during deposition.

7. A process according to claim 4, wherein the gaseous mixture also comprises a gaseous composition of a type n or p doping element.

8. A process according to claim 1, wherein it comprises a stage following the deposition during which the silicon-containing layer and an element of column IVa of the periodic classification undergoes heat treatment in the presence of a plasma containing hydrogen or one of its isotopes, the treatment temperature being below the crystallization temperature T.

* * * * *